(12) United States Patent
Kim

(10) Patent No.: US 9,478,739 B2
(45) Date of Patent: Oct. 25, 2016

(54) FABRICATING ELECTRONIC DEVICE INCLUDING A SEMICONDUCTOR MEMORY THAT COMPRISES AN INTER-LAYER DIELECTRIC LAYER WITH FIRST AND SECOND NITRIDE LAYER OVER STACKED STRUCTURE

(71) Applicant: SK hynix Inc., Icheon (KR)

(72) Inventor: Seong-Hyun Kim, Icheon (KR)

(73) Assignee: SK HYNIX INC., Icheon (KR)

( * ) Notice: Subject to any disclaimer, the term of this patent is extended or adjusted under 35 U.S.C. 154(b) by 196 days.

(21) Appl. No.: 14/571,235

(22) Filed: Dec. 15, 2014

(65) Prior Publication Data
US 2016/0005963 A1 Jan. 7, 2016

(30) Foreign Application Priority Data
Jul. 3, 2014 (KR) .................. 10-2014-0082904

(51) Int. Cl.
| | |
|---|---|
| G06F 3/00 | (2006.01) |
| H01L 45/00 | (2006.01) |
| G06F 3/06 | (2006.01) |
| G06F 12/08 | (2016.01) |
| G06F 5/14 | (2006.01) |
| H01L 21/768 | (2006.01) |
| C23C 16/40 | (2006.01) |

(52) U.S. Cl.
CPC ......... *H01L 45/1253* (2013.01); *C23C 16/405* (2013.01); *G06F 3/0617* (2013.01); *G06F 3/0643* (2013.01); *G06F 3/0679* (2013.01); *G06F 5/14* (2013.01); *G06F 12/0802* (2013.01); *H01L 21/76838* (2013.01); *H01L 45/1233* (2013.01); *H01L 45/14* (2013.01); *H01L 45/141* (2013.01); *H01L 45/145* (2013.01); *H01L 45/147* (2013.01); *H01L 45/16* (2013.01); *G06F 2205/126* (2013.01); *G06F 2212/222* (2013.01)

(58) Field of Classification Search
CPC ........... C23C 16/405; H01L 21/76838; H01L 45/1253; G06F 3/0617
USPC ........ 257/E21.019, E21.002, 2; 710/1, 8, 57
See application file for complete search history.

(56) References Cited

U.S. PATENT DOCUMENTS

| | | | | |
|---|---|---|---|---|
| 6,995,071 | B2 * | 2/2006 | Oh .................. | C23C 16/405 257/E21.019 |
| 7,473,590 | B2 * | 1/2009 | Jeong ............... | H01L 21/76838 257/E21.002 |
| 2004/0248361 | A1 * | 12/2004 | Oh .................. | C23C 16/405 438/240 |
| 2010/0159689 | A1 * | 6/2010 | Son ................. | H01L 21/823425 438/607 |
| 2011/0220861 | A1 | 9/2011 | Himeno et al. | |
| 2011/0233503 | A1 * | 9/2011 | Hwang ............. | H01L 27/2409 257/2 |
| 2014/0252460 | A1 * | 9/2014 | Lee ................. | H01L 29/7827 257/330 |

FOREIGN PATENT DOCUMENTS

KR  10-2010-0082341 A  7/2010

\* cited by examiner

*Primary Examiner* — Tammara Peyton

(57) ABSTRACT

An electronic device includes a semiconductor memory that includes: an inter-layer dielectric layer including a hole over a substrate; a first nitride layer disposed on sidewalls of the hole; a selector disposed in a bottom portion of the hole and over the first nitride layer on the sidewalls of the hole; a stacked structure including a variable resistance pattern disposed over a lower structure including the selector; and a second nitride layer disposed in an upper portion and on sidewalls of the stacked structure.

35 Claims, 14 Drawing Sheets

FABRICATING ELECTRONIC DEVICE INCLUDING A SEMICONDUCTOR MEMORY THAT COMPRISES AN INTER-LAYER DIELECTRIC LAYER WITH FIRST AND SECOND NITRIDE LAYER OVER STACKED STRUCTURE

CROSS-REFERENCE TO RELATED APPLICATION

The present application claims priority to Korean Patent Application No. 10-2014-0082904, entitled "ELECTRONIC DEVICE AND METHOD FOR FABRICATING THE SAME" and filed on Jul. 3, 2014, which is incorporated by reference herein in its entirety.

BACKGROUND

1. Field

This patent document relates to memory circuits or devices and their applications in electronic devices or systems.

2. Description of the Related Art

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistance states according to an applied voltage or current, for example, a Resistive Random Access Memory (RRAM) device, a Phase Change Random Access Memory (PRAM) device, a Ferroelectric Random Access Memory device (FRAM), a Magnetic Random Access Memory (MRAM) device, an E-fuse, etc.

SUMMARY

The disclosed technology in this patent document includes memory circuits or devices and their applications in electronic devices or systems and various implementations of an electronic device in which properties of a variable resistance element may be improved, and a method for fabricating the electronic device.

In one aspect, an electronic device includes a semiconductor memory that includes: an inter-layer dielectric layer including a hole over a substrate; a first nitride layer formed on sidewalls of the hole; a selector formed in a bottom portion of the hole and over the first nitride layer on the sidewalls of the hole; a stack including a variable resistance pattern formed over a lower structure including the selector; and a second nitride layer formed in an upper portion and on sidewalls of the stack.

Implementations of the above electronic device may include one or more the following.

A contact plug penetrating the inter-layer dielectric layer and contacting the substrate in a lower portion of the hole. The second nitride layer has higher density than the first nitride layer. The selector includes one among selection elements such as a Metal Insulator Transition (MIT) layer, a crested barrier layer and an Ovonic Threshold Switch (OTS) material. The line width of the selector formed in the bottom portion of the hole is smaller than the line width of the contact plug. The stack includes a structure where a first electrode, a variable resistance pattern and a second electrode are stacked. A portion of the first electrode fills the hole. The first electrode and the second electrode include a nitride and one transition metal selected from the group consisting of TiN, Pt, W, TaN, Ir, Ni, Cu, Ta, Ti, Hf and Zr. The variable resistance pattern includes a single-layer structure or a multi-layer structure. The variable resistance pattern includes a transition metal oxide, a metal oxide such as a perovskite-based material, a phase change material such as a chalcogenide-based material, a high-K material, a ferromagnetic material and so on.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the resistance variable pattern is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the resistance variable pattern is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the resistance variable pattern is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the resistance variable pattern is part of the memory or the buffer memory in the memory system.

In another aspect, an electronic device includes a semiconductor memory that includes: a selector formed over a substrate; a first nitride layer formed on sidewalls of the selector; a stack including a variable resistance pattern formed over the selector; and a second nitride layer formed in an upper portion and on sidewalls of the stack.

Implementations of the above method may include one or more of the following.

The substrate includes a contact plug contacting the selector. The second nitride layer has higher density than the first nitride layer. The selector includes one among selection elements such as a Metal Insulator Transition (MIT) layer, a crested barrier layer and an Ovonic Threshold Switch (OTS) material.

In another aspect, an electronic device includes a semiconductor memory that includes: a selector formed over a substrate; a first nitride layer formed on sidewalls of the selector; a stack including a variable resistance pattern formed over the selector and the first nitride layer; and a second nitride layer formed in an upper portion of the stack and on sidewalls of the first nitride layer and the stack.

Implementations of the above method may include one or more of the following.

The substrate includes a contact plug contacting the selector. The second nitride layer has higher density than the first nitride layer. The selector includes one among selection elements such as a Metal Insulator Transition (MIT) layer, a crested barrier layer and an Ovonic Threshold Switch (OTS) material.

In another aspect, a method for fabricating an electronic device including a semiconductor memory, comprising: forming an inter-layer dielectric layer over a substrate; forming a contact hole penetrating the inter-layer dielectric layer; forming a contact plug filling a portion of the contact hole; forming a first nitride layer on sidewalls of the contact hole over the contact plug; forming a selector in an upper portion of the contact plug and over the first nitride layer; forming a stack including a variable resistance pattern over a lower structure including the selector; and forming a second nitride layer in an upper portion and on sidewalls of the stack.

Implementations of the above method may include one or more of the following.

The contact plug includes: forming a contact plug by burying a conductive material in the contact hole; and recessing the contact plug to predetermined thickness. The second nitride layer has higher density than the first nitride layer. The first nitride layer is formed in a shorter time than the second nitride layer. The first nitride layer is formed through a Plasma Enhanced Chemical Vapor Deposition (PECVD) process. The second nitride layer is formed through an Atomic Layer Deposition (ALD) process. The forming of the stack including the variable resistance pattern includes: stacking a first electrode layer, a variable resistance pattern and a second electrode layer over a lower structure including the selector; and forming a stack by etching the second electrode layer, the variable resistance pattern and the first electrode layer. The selector includes one among selection elements such as a Metal Insulator Transition (MIT) layer, a crested barrier layer and an Ovonic Threshold Switch (OTS) material. The first electrode layer and the second electrode layer include a nitride and one transition metal selected from the group consisting of TiN, Pt, W, TaN, Ir, Ni, Cu, Ta, Ti, Hf and Zr. The variable resistance pattern includes a transition metal oxide, a metal oxide such as a perovskite-based material, a phase change material such as a chalcogenide-based material, a high-K material, a ferromagnetic material and so on. The variable resistance pattern includes a single-layer structure or a multi-layer structure.

In other aspect, a method for fabricating an electronic device including a semiconductor memory, comprising: forming an inter-layer dielectric layer over a substrate; forming a contact hole penetrating the inter-layer dielectric layer; forming a contact plug filling a portion of the contact hole; forming a first nitride layer on sidewalls of the contact hole over the contact plug; forming a selector in an upper portion of the contact plug and over the first nitride layer; forming a stack including a variable resistance pattern over a lower structure including the selector; and forming a second nitride layer in an upper portion of the stack and on sidewalls of the first nitride layer and the stack.

DETAILED DESCRIPTION

Figure 1:
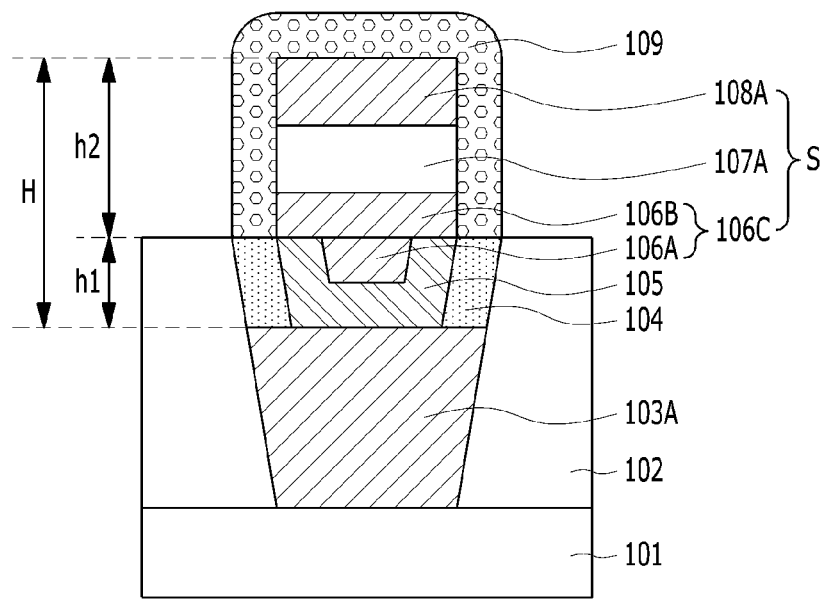
FIG. 1 is a cross-sectional view illustrating a semiconductor device in accordance with a first implementation of the present disclosure.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Throughout the present disclosure, like reference numerals refer to like parts throughout the various figures and embodiments of the present disclosure.

FIG. 1 is a cross-sectional view illustrating a semiconductor device in accordance with a first implementation of the present disclosure.

Referring to FIG. 1, an inter-layer dielectric layer 102 may be formed over a substrate 101, and a contact hole (not shown) may be formed to penetrate the inter-layer dielectric layer 102. In this implementation, the contact hole may have a slanted sidewall, and thus the width of the contact hole gradually increases from the bottom of the contact hole to the top of the contact hole.

After that, a contact plug 103A may be formed to fill a lower portion of the contact hole and to contact the substrate 101. A first nitride layer 104 may be formed on sidewalls of an upper portion of the contact hole over the contact plug 103A, and a selector 105 may be formed in the upper portion of the contact hole to be conformal, i.e., to have a predetermined thickness, along the surface profile of the contact plug 103A and the first nitride layer 104. A stacked structure S, where a first electrode 106C, a variable resistance pattern 107A, and a second electrode 108A are stacked, may be formed over the selector 105. The first electrode 106C includes a lower portion 106A and an upper portion 106B. The lower portion 106A is formed over the selector 105 to fill the remainder of the contact hole, and the upper portion 106B is disposed over the selector 105 and the lower portion 106A. A second nitride layer 109 may be formed on the top surface and sidewalls of the stacked structure S.

The selector 105, the first electrode 106C, the variable resistance pattern 107A, and the second electrode 108A may form a cell structure. When a total thickness of the cell structure is H, the selector 105 and the lower portion 106A of the first electrode 106C, which are buried in the inter-layer dielectric layer 102, have a thickness h1. The upper portion 106B of the first electrode 106C, the variable resistance pattern 107A and the second electrode 108A, which protrude from the top surface of the inter-layer dielectric layer 102, have a thickness h2. In this implementation, since the selector 105 is buried in the inter-layer dielectric layer 102, the selector 105 is formed before performing an etch process to form the upper portion 106B of the first electrode 106C, the variable resistance pattern 107A, and the second electrode 108A. As a result, the thickness of layers to be etched in an etch process for forming the cell structure is reduced from the thickness H to the thickness h2. Therefore, the increase of a fabrication process margin, which is caused by a decrease in an etch target during a cell structure formation, may be secured.

The inter-layer dielectric layer 102 may include one or more of oxide-based materials. For example, the oxide-based materials may include one or more among a silicon oxide, a Tetra Ethyl Ortho Silicate (TEOS), a Boron Phosphorus Silicate Glass (BPSG), a Boron Silicate Glass (BSG), a Phosphorus Silicate Glass (PSG), and a Fluorinated Silicate Glass (FSG).

The selector 105 may include one among selection elements such as a Metal Insulator Transition (MIT) layer, a crested barrier layer and an Ovonic Threshold Switch (OTS) layer. Joule heat is generated when current flows through the MIT layer, and consequently a switching operation may be performed at a predetermined threshold voltage.

Particularly, an MIT layer may be used as a selection element in a cross-point cell array structure, and thus sneak current may be effectively prevented from flowing through an unselected cell. The MIT layer may be formed of one or more of a niobium oxide ($NbO_x$, $2 \leq x \leq 2.5$) and a vanadium oxide ($VO_x$, $2 \leq x \leq 2.5$), whose electric resistance dramatically changes, transitioning from a dielectric substance to a metallic substance or from a metallic substance to a dielectric substance due to changes in a crystal structure at a predetermined threshold temperature. To be specific, a representative MIT material is dioxide such as $NbO_2$ and $VO_2$, and an MIT phenomenon may occur when $NbO_2$ and $VO_2$ channels are locally generated from $Nb_2O_5$ and $V_2O_5$, respectively.

The crested barrier layer may include a stacked structure of a tantalum oxide layer $TaO_x$, a titanium oxide layer $TiO_x$, and a tantalum oxide layer $TaO_x$, wherein x is a natural number. The OTS layer may be formed of one or more materials selected from the group including Te, Se, Ge, Si, As, Ti, S and Sb, and particularly, include a TeAsGeSi-based material.

The selector 105 may be formed with a smaller line width than a line width at the top surface of the contact plug 103A in order to reduce off-current ($I_{off}$). In the implementation shown in FIG. 1, since the selector 105 is formed along the surface profile of the first nitride layer 104 formed on the sidewalls of the upper portion of the contact hole, the selector 105 also has a slanted sidewall due to the slanted sidewall of the contact hole. Thus, the line width of the selector 105 may gradually increase from bottom to top. However, the largest line width of the selector 105 may not be greater than the line width of the top surface of the contact plug 103A.

The first electrode 106C and the second electrode 108A for supplying a voltage or current to each of the cell structures may be formed of a conductive layer such as a metal layer, a metal nitride layer, a polysilicon layer doped with an impurity, or a combination thereof. The first electrode 106C and the second electrode 108A may include a nitride and a transition material selected from the group including TiN, Pt, W, TaN, Ir, Ni, Cu, Ta, Ti, Hf, and Zr. The first electrode 106C may serve as a lower electrode of the variable resistance pattern 107A and couples the variable resistance pattern 107A to the selector 105, and the second electrode 108A may serve as an upper electrode of the variable resistance pattern 107A. The lower portion 106A of the first electrode 106C may fill the remainder of the contact hole inside the inter-layer dielectric layer 102 after the selector 105 is formed, and the upper portion 106B of the first electrode 106C may be disposed over the selector 105 and the lower portion 106A. The lower and upper portions 106A and 106B of the first electrode 106C may be formed through different fabrication processes or may be simultaneously formed through a single process, e.g., a buried process. In an implementation, if the selector 105 fills the contact hole, the lower portion 106A of the first electrode 106C may be omitted.

The variable resistance pattern 107A may be formed of a material switching between different resistance states depending on a voltage or current supplied thereto. The variable resistance pattern 107A may include one or more of materials that are used for an RRAM, a PRAM, an FRAM, an MRAM, etc. The materials may include a metal oxide, such as a transition metal oxide, a perovskite-based material, or the like, a phase change material such as a chalcogenide-based material, a high-K material, a ferromagnetic material, and so on. The transition metal oxide may include one selected from the group consisting of $TaO_x$, $HfO_x$, $WO_x$, $SiO_x$, $TiO_x$, $ZrO_x$, $NiO_x$, $NbO_x$, $VO_x$, $FeO_x$, $ZnO_x$, $CeO_x$, $CuO_x$ and $MnO_x$, wherein x is a natural number. The variable resistance pattern 107A may have a single-layer structure or a multi-layer structure.

The first nitride layer 104 may serve as a spacer for preventing characteristics of the selector 105 from deteriorating through a reduced thermal budget and nitridation prevention. The first nitride layer 104 may be formed with lower nitrogen density than the second nitride layer 109. This means that the second nitride layer 109 contains more nitrogen particles than the first nitride layer 104.

The second nitride layer 109 may serve as a protective layer to prevent the stacked structure S including the variable resistance pattern 107A from being oxidized. To this end, the second nitride layer 109 may include a high-density nitride layer capable of preventing oxide diffusion.

In another implementation of the present disclosure, the contact plug 103A may be replaced by a conductive line (not shown), or a conductive line (not shown) may be further disposed below the contact plug 103A.

Figure 2:
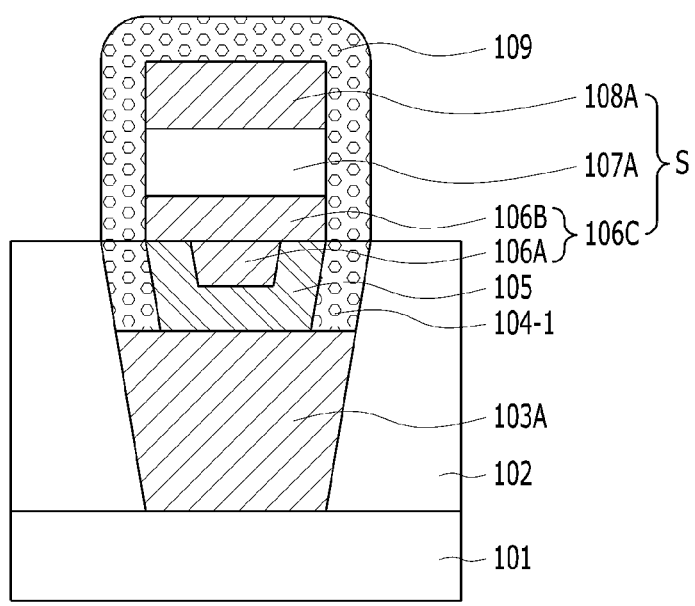
FIG. 2 is a cross-sectional view illustrating a semiconductor device in accordance with a second implementation of the present disclosure.

FIG. 2 is a cross-sectional view illustrating a semiconductor device in accordance with a second implementation of the present disclosure.

Referring to FIG. 2, a semiconductor device in accordance with the second implementation may include substantially the same structure as the semiconductor device of FIG. 1. However, while, in the structure of FIG. 1, the first nitride layer 104 has different nitrogen density from the second nitride layer 109, in the structure of FIG. 2, a first nitride layer 104-1 and a second nitride layer 109 may be formed of the same material so that they have the same nitrogen density.

As described above, the first nitride layer 104 or 104-1 may be formed prior to the selector 105 in order to prevent the selector 105 from being nitrified and/or deoxidized.

FIGS. 3A to 3F are cross-sectional views illustrating a method for fabricating the semiconductor device in accordance with the first implementation of the present disclosure.

Figure 3A:
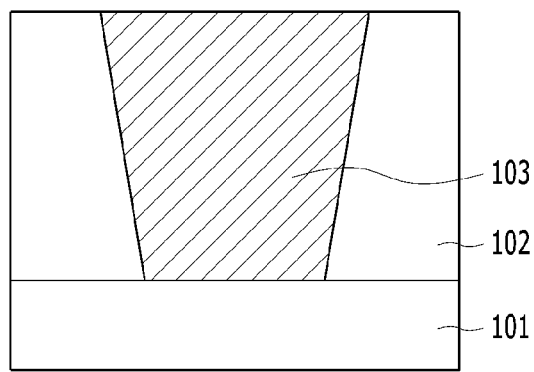
FIGS. 3A to 3F are cross-sectional views illustrating a method for fabricating the semiconductor device in accordance with the first implementation of the present disclosure.

Referring to FIG. 3A, an inter-layer dielectric layer 102 may be formed over a substrate 101. The inter-layer dielectric layer 102 may include one or more of oxide-based materials. For example, the oxide-based materials may include a silicon oxide, a Tetra Ethyl Ortho Silicate (TEOS), a Boron Phosphorus Silicate Glass (BPSG), a Boron Silicate Glass (BSG), a Phosphorus Silicate Glass (PSG) and a Fluorinated Silicate Glass (FSG).

Subsequently, a contact hole (not shown) penetrating the inter-layer dielectric layer 102 may be formed.

Subsequently, a contact plug 103 may be formed by filling the contact hole with a conductive material. The contact plug 103 may couple the substrate 101 with a structure formed over the contact plug 103.

Figure 3B:
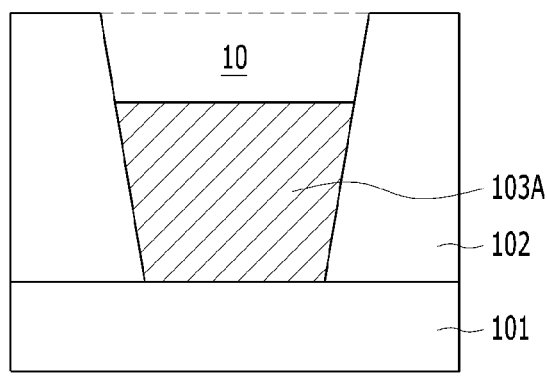

Referring to FIG. 3B, the contact plug 103 may be etched back by a predetermined thickness. As a result, a recessed contact plug 103A is formed. As the contact plug 103 is etched back by the predetermined thickness, a hole 10 may be formed over the recessed contact plug 103A and within the inter-layer dielectric layer 102.

Figure 3C:
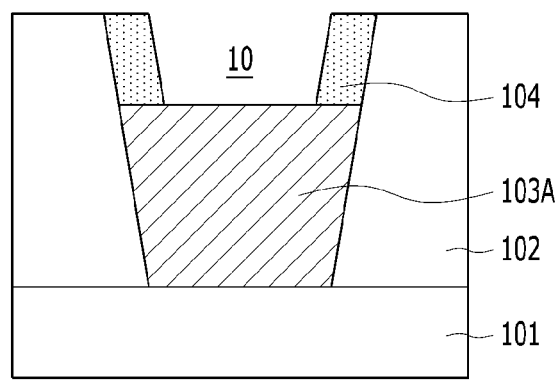

Referring to FIG. 3C, a first nitride layer 104 may be formed on sidewalls of the hole 10 by forming a nitride layer over the structure including the hole 10 and performing a spacer etch process on the nitride layer so that the first nitride layer remains only on the sidewalls of the hole 10. The first nitride layer 104 may prevent a selector, which is to be formed through a subsequent process, from being nitrified and/or deoxidized.

The first nitride layer 104 may be formed to have lower nitrogen density than a second nitride layer to be formed through a subsequent process as described with reference to FIG. 1, or it may be formed of the same material as the second nitride layer as described with reference to FIG. 2. The first nitride layer 104 having the low nitrogen density may be formed through a Plasma Enhanced Chemical Vapor Deposition (PECVD) process. The PECVD process may be performed using a nitrogen ($N_2$) gas as a carrier gas and silane ($SiH_4$) and ammonia ($NH_3$) gases as a source gas. The first nitride layer 104 may be formed in a short fabrication process time, and consequently it is possible to form the first nitride layer 104 having low nitrogen density.

Figure 3D:
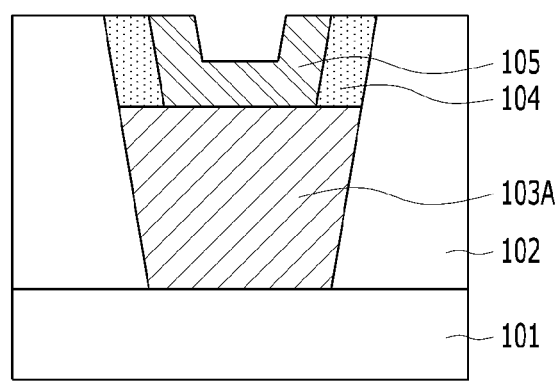

Referring to FIG. 3D, a selector 105 may be formed to be conformal along surface profiles of the recessed contact plug 103A and the first nitride layer 104 so that the selector 105 is formed over the bottom of the hole 10 and sidewalls of the first nitride layer 104. In particular, the selector 105 may be formed by forming a selector material layer over the entire structure including the first nitride layer 104 and the contact plug 103A to fill the remainder of the hole 10 after the first nitride layer 104 is formed and performing an isolation process on the selector material layer so that the selector material layer remains only inside the hole 10. As a result, the selector 105 may have substantially the same thickness over the bottom of the hole 10 and over the first nitride layer 104. The isolation process may include a Chemical Mechanical Polishing (CMP) process. The selector 105 may include one among selection elements such as a Metal Insulator Transition (MIT) layer, a crested barrier layer and an Ovonic Threshold Switch (OTS) layer. The selector 105 may be formed with a smaller line width than the line width of the top surface of the contact plug 103A in order to reduce off-current ($I_{off}$).

In this implementation, since the first nitride layer 104 is formed prior to the selector 105, the selector 105 may be protected from nitrification and/or deoxidization that may occur in the selector 105 if the first nitride layer 104 is formed after the formation of the selector 105.

Figure 3E:
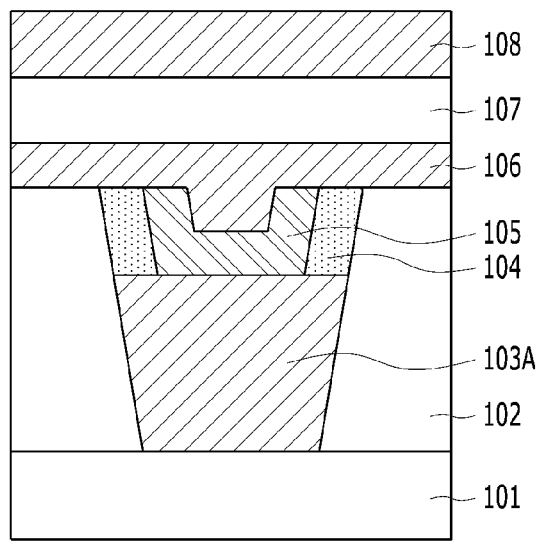

Referring to FIG. 3E, a first electrode layer 106, a variable resistance layer 107 and a second electrode layer 108 may be stacked in order over a lower structure including the selector 105. The lower structure may include the selector 105, the first nitride layer 104, the inter-layer dielectric layer 102, and the contact plug 103A.

The first electrode layer 106 and the second electrode layer 108 may be formed of a conductive layer such as a metal layer, a metal nitride layer, a polysilicon layer doped with an impurity, or a combination thereof. The first electrode layer 106 includes a lower portion, which fills the remainder of the hole 10 after the selector 105 is formed, and an upper portion, which covers the first nitride layer 104, the selector 105, and the inter-layer dielectric layer 102.

The variable resistance layer 107 may be formed of a material switching between different resistance states depending on the voltage or current supplied thereto. For example, the variable resistance layer 107 may include one or more of materials that are used for an RRAM, a PRAM, an FRAM, an MRAM, etc. Such materials may include a metal oxide, such as a transition metal oxide, a perovskite-based material, or the like, a phase change material such as a chalcogenide-based material, a high-K material, a ferro-magnetic material, and so on. The variable resistance layer 107 may have a single-layer structure or a multi-layer structure as necessary.

Figure 3F:
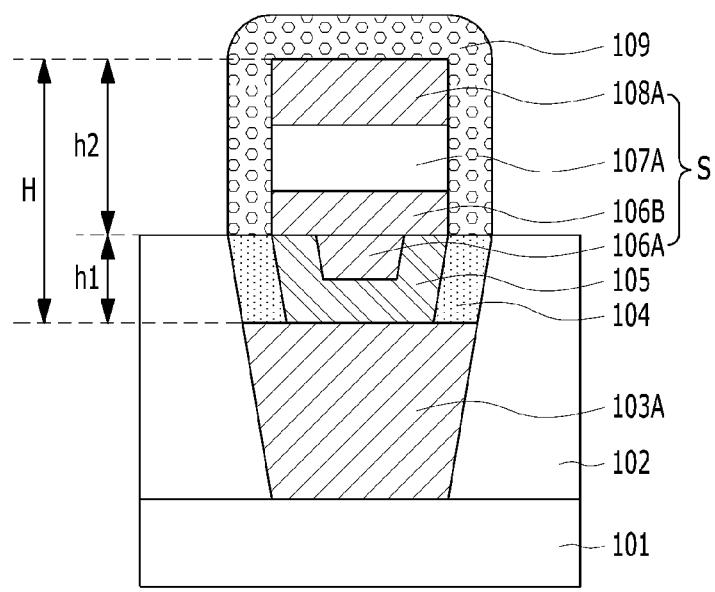

Referring to FIG. 3F, a stacked structure S may be formed by patterning the second electrode layer 108, the variable resistance layer 107 and the first electrode layer 106. As a result, a cell structure including the selector 105, the first electrode 106A and 106B, the variable resistance pattern 107A and the second electrode 108A may be formed.

Particularly, as the selector 105 is formed to be buried inside the inter-layer dielectric layer 102 in an implementation, a thickness to be etched in the patterning process for forming the cell structure may be decreased compared to a case in which the selector 105 is formed over the inter-layer dielectric layer 102 and thus patterned together with the second electrode layer 108, the variable resistance layer 107 and the first electrode layer 106. That is, in this implementation, the thickness to be etched in the patterning process is reduced to a thickness h2, which is decreased from a thickness H of the cell structure by a thickness h1 of the selector 105. Since an etch target thickness decreases by the thickness of the selector 105 from the whole thickness H of the cell structure, a fabrication process margin may increase accordingly.

Subsequently, a second nitride layer 109 may be formed on the top surface and sidewalls of the stacked structure S to enclose the stacked structure S. The second nitride layer 109 may serve as a protective layer to prevent the stacked structure S from being oxidized. To this end, the second nitride layer 109 may be formed of a nitride layer having high nitrogen density. The second nitride layer 109 may be formed through an Atomic Layer Deposition (ALD) process. As the second nitride layer 109 is formed through the ALD process, the second nitride layer 109 may have fine step coverage.

Subsequently, although not shown in the drawings, a dielectric layer filling the space between stacked structures, i.e., cell structures, may be formed, and then a method for fabricating the semiconductor device through a series of subsequent fabrication processes may be carried out.

Figure 4:
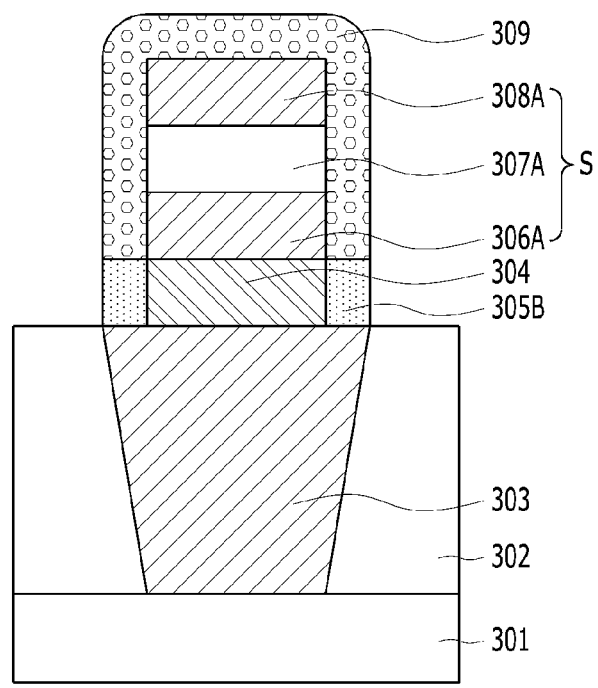
FIG. 4 is a cross-sectional view illustrating a semiconductor device in accordance with a third implementation of the present disclosure.

FIG. 4 is a cross-sectional view illustrating a semiconductor device in accordance with a third implementation of the present disclosure.

Referring to FIG. 4, an inter-layer dielectric layer 302 may be formed over a substrate 301, and a contact plug 303 may be formed to contact the substrate 301 and to penetrate the inter-layer dielectric layer 302. In this implementation, the contact plug 303 has a slanted sidewall so that the line width of the contact plug 303 gradually increases from bottom to top.

After that, a cell structure, which includes a stacked structure of a selector 304, a first electrode 306A, a variable resistance pattern 307A and a second electrode 308A, may be formed over a lower structure including the contact plug 303. The line width of the cell structure may be smaller than the line width of the contact plug 303 at its topmost surface. A first nitride layer 305B may be formed on sidewalls of the selector 304 and over an outer portion of the top surface of the contact plug 303 over which the cell structure is not disposed, and a second nitride layer 309 may be formed on the top surface and sidewalls of a stacked structure S in which the first electrode 306A, the variable resistance pattern 307A and the second electrode 308A are stacked.

Figure 5A:
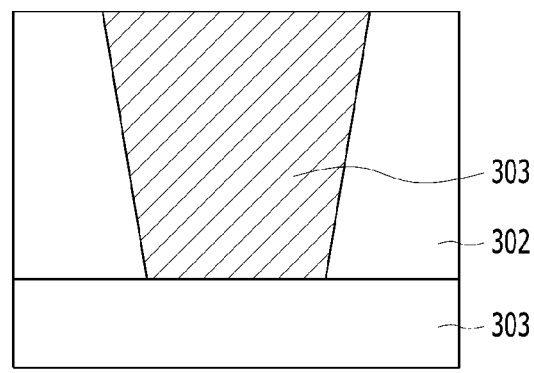
FIGS. 5A to 5E are cross-sectional views illustrating a method for fabricating the semiconductor device in accordance with the third implementation of the present disclosure.

FIGS. 5A to 5E are cross-sectional views illustrating a method for fabricating the semiconductor device in accordance with the third implementation of the present disclosure. Referring to FIG. 5A, an inter-layer dielectric layer 302 may be formed over a substrate 301. The inter-layer dielectric layer 302 may include one or more of oxide-based materials. For example, the oxide-based materials may include a silicon oxide, a Tetra Ethyl Ortho Silicate (TEOS), a Boron Phosphorus Silicate Glass (BPSG), a Boron Silicate Glass (BSG), a Phosphorus Silicate Glass (PSG) and a Fluorinated Silicate Glass (FSG).

Subsequently, a contact hole (not shown) penetrating the inter-layer dielectric layer 302 may be formed. In this implementation, the contact hole may have a slanted sidewall, and the width of the contact hole gradually increases from bottom to top.

Subsequently, a contact plug 303 may be formed to fill the contact hole with conductive materials. The contact plug 303 may couple the substrate 301 with a structure formed over the contact plug 303.

Figure 5B:
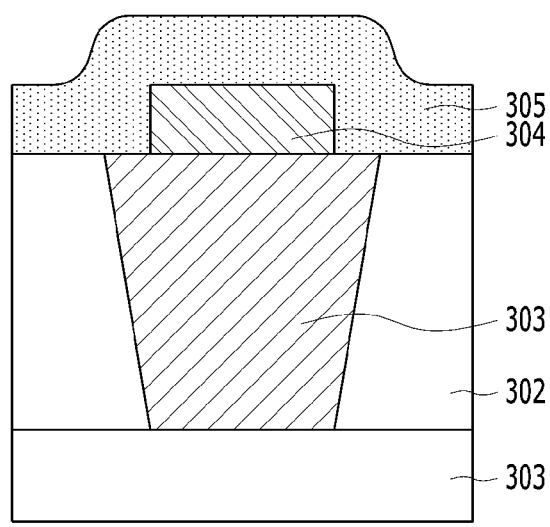

Referring to FIG. 5B, a selector 304 may be formed over the contact plug 303. The selector 304 may include one among selection elements such as a Metal Insulator Transition (MIT) layer, a crested barrier layer and an Ovonic Threshold Switch (OTS) layer. The selector 304 may be formed with a smaller line width than the line width of the top surface of the contact plug 303 in order to reduce off-current ($I_{off}$).

Subsequently, a first nitride layer 305 may be formed over the structure including the selector 304. The first nitride layer 305 may be formed of a nitride layer having low nitrogen density in order to prevent the selector 304 from being nitrified and/or deoxidized when the selector 304 is exposed to a nitrogen gas having high nitrogen density for a long duration during a process of forming the first nitride layer 305. The first nitride layer 305 having the low nitrogen density may be formed through a Plasma Enhanced Chemical Vapor Deposition (PECVD) process. The PECVD process forming the first nitride layer 305 may be performed using a $N_2$ gas as a carrier gas and $SiH_4$ and $NH_3$ gases as a source gas. The first nitride layer 305 may be formed in a short time, and consequently it is possible to form the nitride layer 305 having low nitrogen density without causing a nitrification reaction and/or a deoxidation reaction in the selector 304.

Figure 5C:
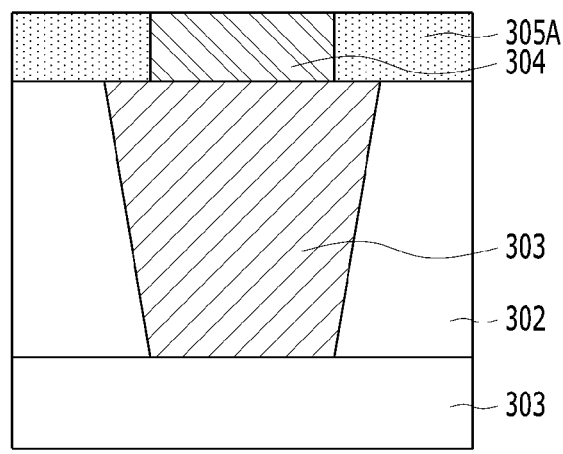

Referring to FIG. 5C, the first nitride layer 305 may be planarized until the top surface of the selector 304 is exposed. The planarized first nitride layer is represented by reference numeral 305A.

In the implementation shown in FIGS. 5B and 5C, the selector 304 is formed prior $t_o$ the first nitride layer 305. However, in another implementation, the selector 304 may be formed after the first nitride layer 305 is formed. That is, after the first nitride layer 305 is formed to cover the contact plug 303 and the inter-layer dielectric layer 302, an opening may be formed in the first nitride layer 305 to expose a portion of the contact plug 303, and then a process for forming the selector 304 in the opening may be carried out. In this implementation, since the first nitride layer 305 is formed prior to the selector 304, and thus the process of forming the first nitride layer 305 may not cause a nitrification reaction and/or a deoxidation reaction in the selector 304, the first nitride layer 305 may be formed without limiting nitrogen density. That is, the first nitride layer 305 may be formed to have high nitrogen density.

Figure 5D:
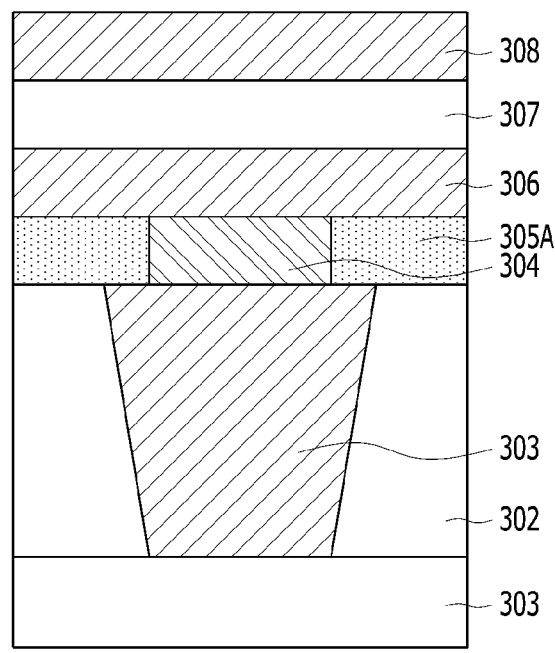

Referring to FIG. 5D, a first electrode layer 306, a variable resistance layer 307 and a second electrode layer 308 may be stacked in order over a lower structure including the selector 304 and the first nitride layer 305A.

The first electrode layer 306 and the second electrode layer 308 may be formed of a conductive layer such as a metal layer, a metal nitride layer, a polysilicon layer doped with an impurity, or a combination thereof.

The variable resistance layer 307 may be formed of a material switching between different resistance states depending on the voltage or current supplied thereto. The variable resistance layer 307 may include one or more of materials that are used for an RRAM, a PRAM, an FRAM, an MRAM, etc. Such materials may include a metal oxide, such as a transition metal oxide, a perovskite-based material, or the like, a phase change material such as a chalcogenide-based material, a high-K material, a ferromagnetic material, and so on. The variable resistance layer 307 may have a single-layer structure or a multi-layer structure as necessary.

Figure 5E:
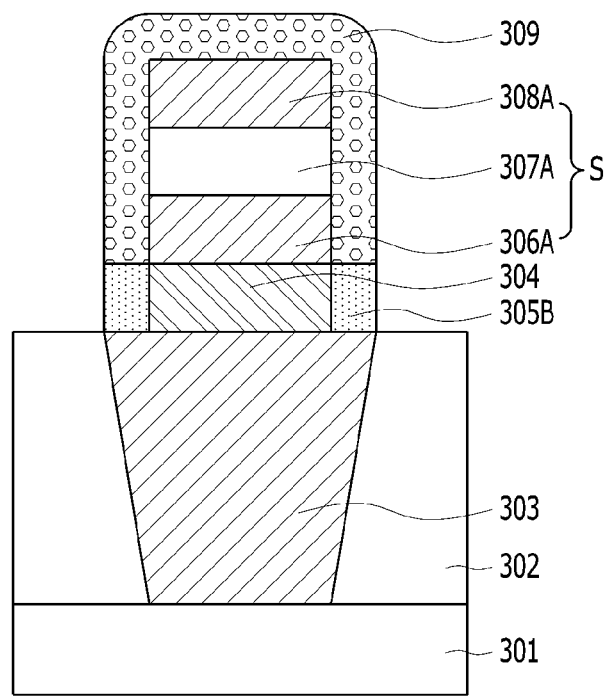

Referring to FIG. 5E, a stacked structure S may be formed by patterning the second electrode layer 308, the variable resistance layer 307 and the first electrode layer 306. As a result, a cell structure including the selector 304, the first electrode 306A, the variable resistance pattern 307A and the second electrode 308A may be formed. The stacked structure S may have substantially the same line width as the selector 304.

Subsequently, a second nitride layer 309 may be formed on the top surface and sidewalls of the stacked structure S. The second nitride layer 309 may serve as a protective layer to prevent the stacked structure S from being oxidized. To this end, the second nitride layer 309 may be formed of a nitride layer having high nitrogen density. The second nitride layer 309 may be formed through an Atomic Layer Deposition (ALD) process. As the second nitride layer 309 is formed through the ALD process, a nitride layer having fine step coverage may be formed. When forming the nitride layer, since the first nitride layer 305A is disposed on sidewalls of the selector 304 and the stacked structure S covers the top surface of the selector 304, a process of forming the nitride layer 309 has no influence on the selector 304.

Subsequently, the second nitride layer 309 and the first nitride layer 305A may be etched. As a result, the second nitride layer 309 may remain on the top surface and the sidewalls of the stacked structure S, and the first nitride layer 305B may remain on the sidewalls of the selector 304.

Subsequently, although not shown in the drawing, a dielectric layer filling the space between stacked structures, i.e., cell structures, may be formed, and then a method for fabricating the semiconductor device through a series of subsequent fabrication processes may be carried out.

Figure 6:
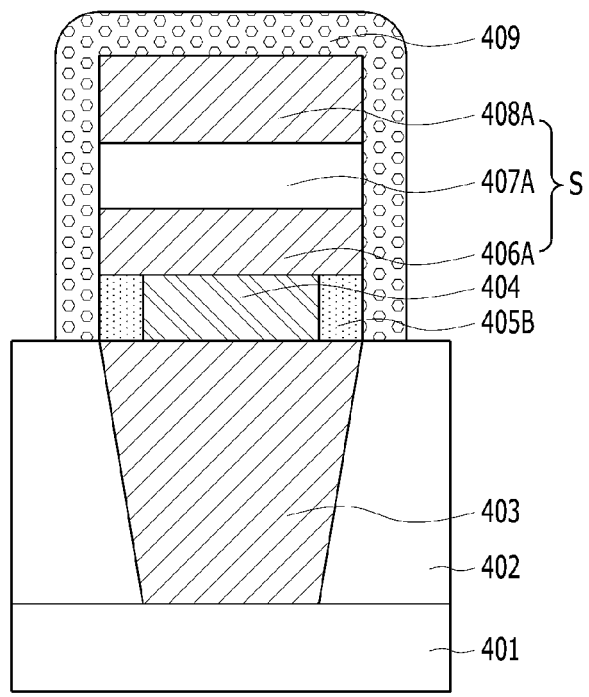
FIG. 6 is a cross-sectional view illustrating a semiconductor device in accordance with a fourth implementation of the present disclosure.

FIG. 6 is a cross-sectional view illustrating a semiconductor device in accordance with a fourth implementation of the present disclosure.

Referring to FIG. 6, an inter-layer dielectric layer 402 may be formed over a substrate 401, a contact plug 403 may be formed to contact the substrate 401 and to penetrate the inter-layer dielectric layer 402. In this implementation, the contact plug 403 has a slanted sidewall so that the width of the contact plug 403 gradually increases from bottom to top.

After that, a selector 404 may be formed over the contact plug 403. The line width of the selector 404 may be smaller than the line width of the top surface of the contact plug 403. A first nitride layer 405B may be formed on sidewalls of the selector 404 and over an outer portion of the top surface of the contact plug 403.

Subsequently, a stacked structure S, which includes a first electrode 406A, a variable resistance pattern 407A and a second electrode 408A, may be formed over the first nitride layer 405B and the selector 404. The line width of the stacked structure S may be substantially the same as the line width at the top surface of the contact plug 403. Thus, a cell structure including the selector 404, the first electrode 406A, the variable resistance pattern 407A and the second electrode 408A may be formed over the contact plug 403.

After that, a second nitride layer 409 may be formed to enclose the cell structure. That is, the second nitride layer 409 may be formed on the top surface and sidewalls of the stacked structure S and on sidewalls of the first nitride layer 405B.

FIGS. 7A to 7E are cross-sectional views illustrating a method for fabricating the semiconductor device in accordance with the fourth implementation of the present disclosure. The processes shown in FIGS. 7A to 7D are substantially the same as the processes shown in FIGS. 5A to 5D.

Figure 7A:
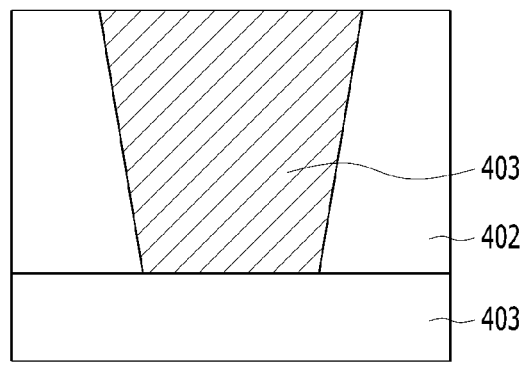
FIGS. 7A to 7E are cross-sectional views illustrating a method for fabricating the semiconductor device in accordance with the fourth implementation of the present disclosure.

Referring to FIG. 7A, an inter-layer dielectric layer 402 may be formed over a substrate 401.

Subsequently, a contact hole (not shown) penetrating the inter-layer dielectric layer 402 may be formed. In this implementation, the contact hole may have a slanted sidewall, and the width of the contact hole gradually increases from bottom to top.

Subsequently, a contact plug 403 may be formed by filling the contact hole with one or more conductive materials.

Figure 7B:
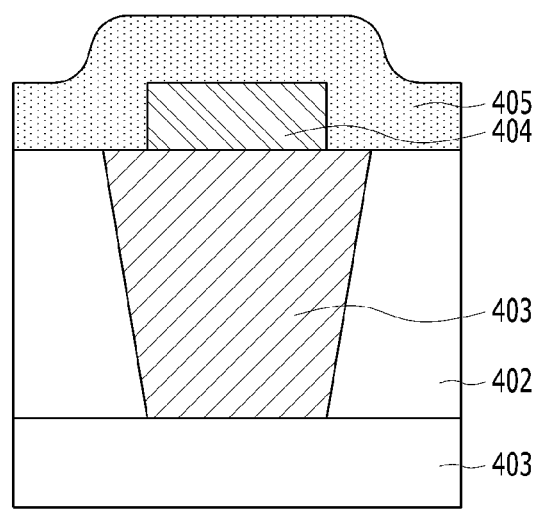

Referring to FIG. 7B, a selector 404 may be formed over the contact plug 403. The line width of the selector 404 may be smaller than the line width at the top surface of the contact plug 403.

Subsequently, a first nitride layer 405 may be formed to cover a structure including the selector 404.

Figure 7C:
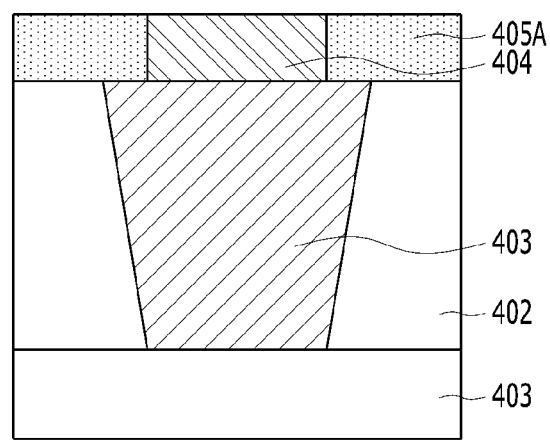

Referring to FIG. 7C, the first nitride layer 405 may be planarized until the top surface of the selector 404 is exposed. The planarized first nitride layer is represented by a reference numeral 405A.

In this implementation shown in FIGS. 7B and 7C, the first nitride layer 405 is formed after the selector 404 is formed. However, in another implementation, the first nitride layer 405 may be formed prior to the selector 404. That is, after the first nitride layer 405 is formed to cover the contact plug 403 and the inter-layer dielectric layer 402, an opening may be formed in the first nitride layer 405 to expose a portion of the contact plug 403, and then a process for filling the opening with a metal oxide may be carried out to form the selector 304 in the opening.

Figure 7D:
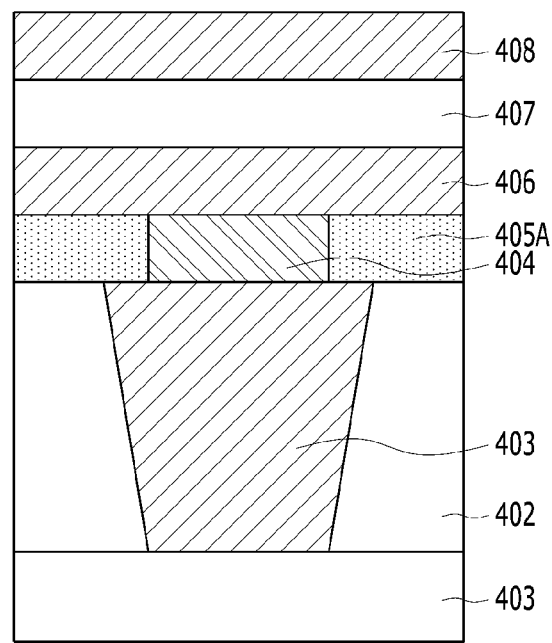

Referring to FIG. 7D, after the first nitride layer 405A and the selector 404 are formed as shown in FIG. 7C, a first electrode layer 406, a variable resistance layer 407 and a second electrode layer 408 may be stacked in order over a lower structure including the selector 404 and the first nitride layer 405A.

Figure 7E:
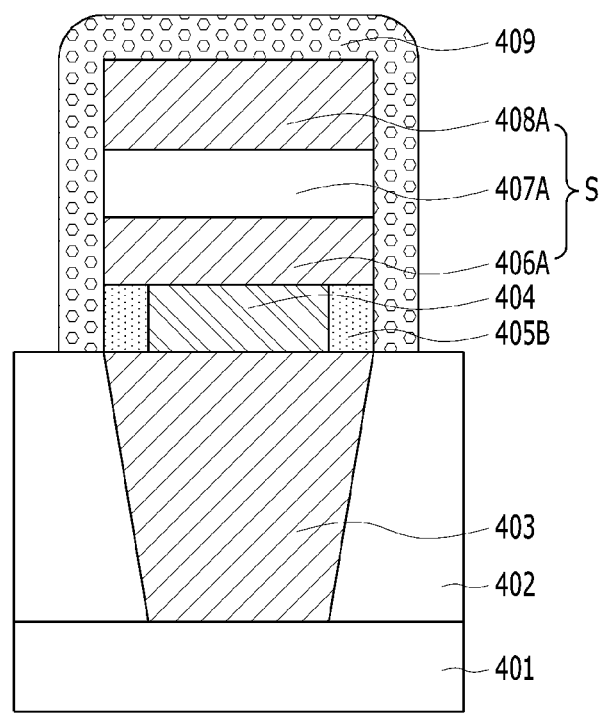

Referring to FIG. 7E, a stacked structure S may be formed by patterning the second electrode layer 408, the variable resistance layer 407 and the first electrode layer 406. Therefore, a cell structure, which includes the selector 404, the first electrode 406A, the variable resistance pattern 407A and the second electrode 408A, may be formed. The stacked structure S may be patterned to have a larger line width than the line width of the selector 404. In an implementation, the stacked structure S may have a line width that is substantially the same as the line width at the top surface of the contact plug 403. The first nitride layer 405A may be patterned together with the stacked structure S and thus may remain in a spacer shape on sidewalls of the selector 404. The patterned first nitride layer is represented by a reference numeral 405B.

Subsequently, a second nitride layer 409 may be formed on the top surface and sidewalls of the stacked structure S and on sidewalls of the patterned first nitride layer 405B.

Subsequently, although not shown in the drawings, a dielectric layer filling the space between stacked structures, i.e., cell structures, may be formed, and then a method for fabricating the semiconductor device through a series of subsequent fabrication processes may be carried out.

The above and other memory circuits or semiconductor devices based on the disclosed technology can be used in a range of devices or systems. FIGS. 8-12 provide some examples of devices or systems that can implement the memory circuits disclosed herein.

Figure 8:
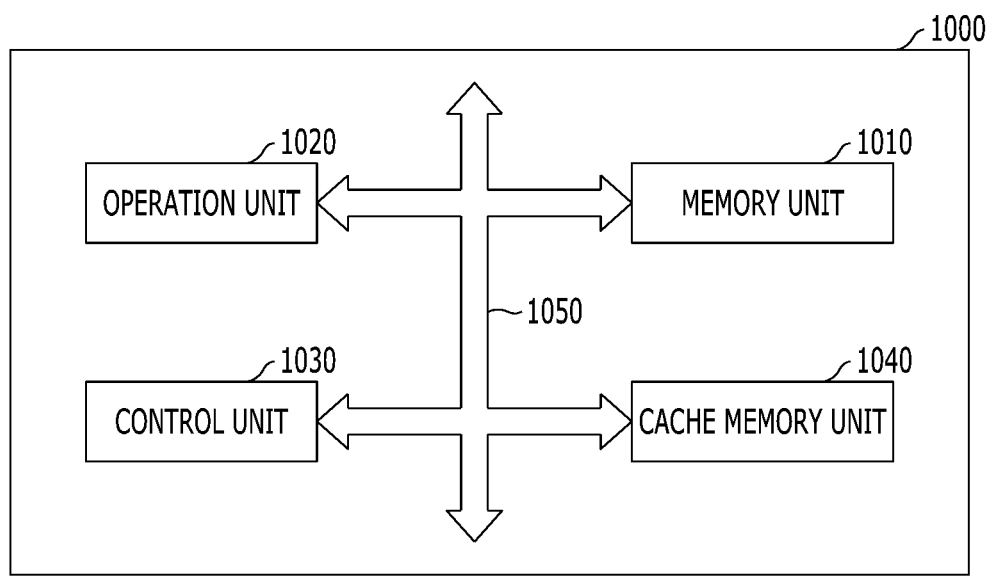
FIG. 8 is an example of configuration diagram of a microprocessor implementing memory circuitry based on the disclosed technology.

FIG. 8 is an example of configuration diagram of a microprocessor implementing memory circuitry based on the disclosed technology.

Referring to FIG. 8, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include an inter-layer dielectric layer including a hole over a substrate; a first nitride layer formed on sidewalls of the hole; a selector formed in a bottom portion of the hole and over the first nitride layer on the sidewalls of the hole; a stack including a variable resistance pattern formed over a lower structure including the selector; and a second nitride layer formed in an upper portion and on sidewalls of the stack. Through this, a fabrication process of the memory unit 1010 may be performed to improve the data storage characteristic of the memory unit 1010. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 9:
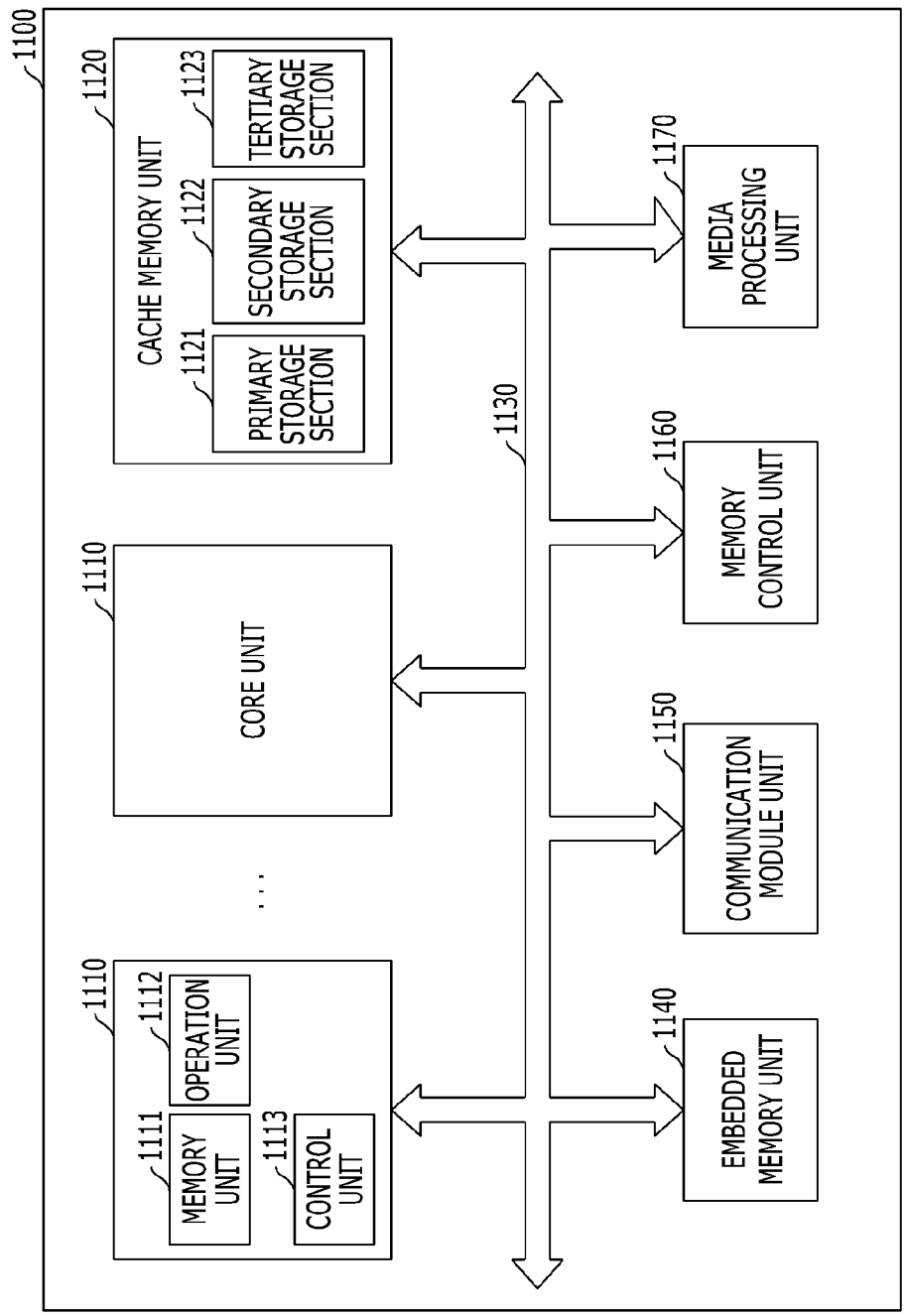
FIG. 9 is an example of configuration diagram of a processor implementing memory circuitry based on the disclosed technology.

FIG. 9 is an example of configuration diagram of a processor implementing memory circuitry based on the disclosed technology.

Referring to FIG. 9, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include an inter-layer dielectric layer including a hole over a substrate; a first nitride layer formed on sidewalls of the hole; a selector formed in a bottom portion of the hole and over the first nitride layer on the sidewalls of the hole; a stack including a variable resistance pattern formed over a lower structure including the selector; and a second nitride layer formed in an upper portion and on sidewalls of the stack. Through this, a fabrication process of the memory unit 1120 may be performed to improve the data storage characteristic of the memory unit 1120. As a consequence, operating characteristics of the processor 1100 may be improved.

Although it was shown in FIG. 9 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 10:
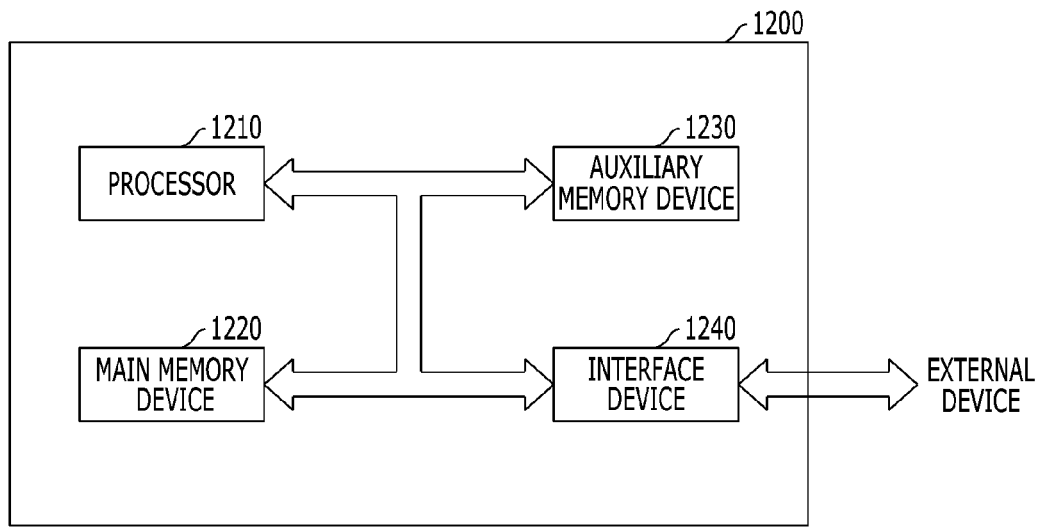
FIG. 10 is an example of configuration diagram of a system implementing memory circuitry based on the disclosed technology.

FIG. 10 is an example of configuration diagram of a system implementing memory circuitry based on the disclosed technology.

Referring to FIG. 10, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include an inter-layer dielectric layer including a hole over a substrate; a first nitride layer formed on sidewalls of the hole; a selector formed in a bottom portion of the hole and over the first nitride layer on the sidewalls of the hole; a stack including a variable resistance pattern formed over a lower structure including the selector; and a second nitride layer formed in an upper portion and on sidewalls of the stack. Through this, a fabrication process of the memory unit 1220 may be performed to improve the data storage characteristic of the memory unit 1220. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include an inter-layer dielectric layer including a hole over a substrate; a first nitride layer formed on sidewalls of the hole; a selector formed in a bottom portion of the hole and over the first nitride layer on the sidewalls of the hole; a stack including a variable resistance pattern formed over a lower structure including the selector; and a second nitride layer formed in an upper portion and on sidewalls of the stack. Through this, a fabrication process of the memory unit 1230 may be performed to improve the data storage characteristic of the memory unit 1230. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 11) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 11:
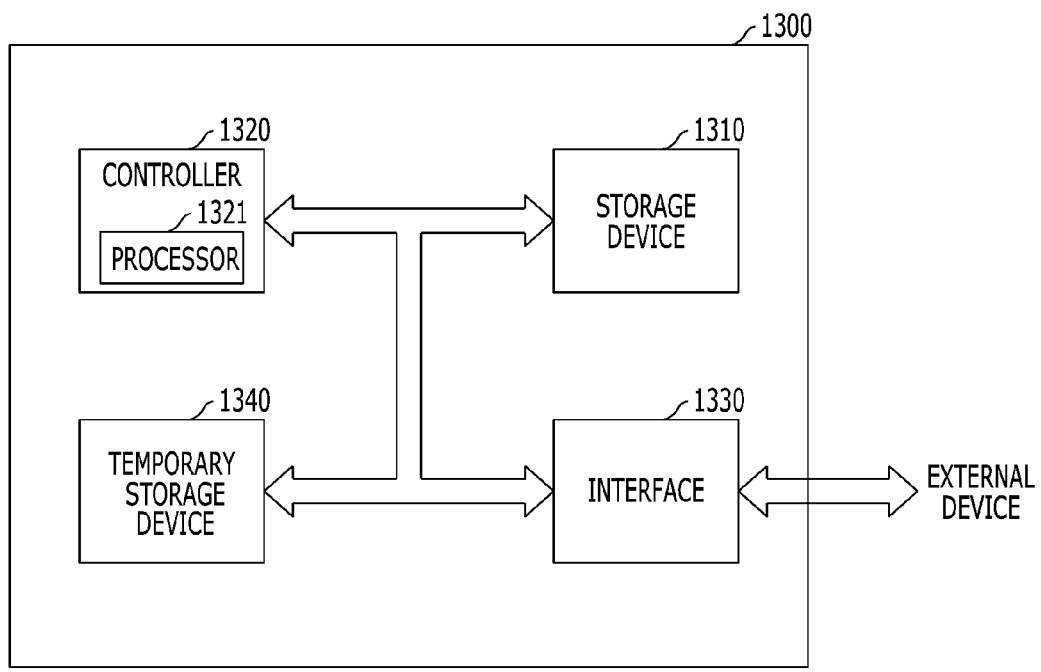
FIG. 11 is an example of configuration diagram of a data storage system implementing memory circuitry based on the disclosed technology.

FIG. 11 is an example of configuration diagram of a data storage system implementing memory circuitry based on the disclosed technology.

Referring to FIG. 11, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include an inter-layer dielectric layer including a hole over a substrate; a first nitride layer formed on sidewalls of the hole; a selector formed in a bottom portion of the hole and over the first nitride layer on the sidewalls of the hole; a stack including a variable resistance pattern formed over a lower structure including the selector; and a second nitride layer formed in an upper portion and on sidewalls of the stack. Through this, a fabrication process of the storage device 1310 or the temporary storage device 1340 may be performed to improve the data storage characteristic of the storage device 1310 or the temporary storage device 1340. As a consequence, operating characteristics of the data storage system 1300 may be improved.

Figure 12:
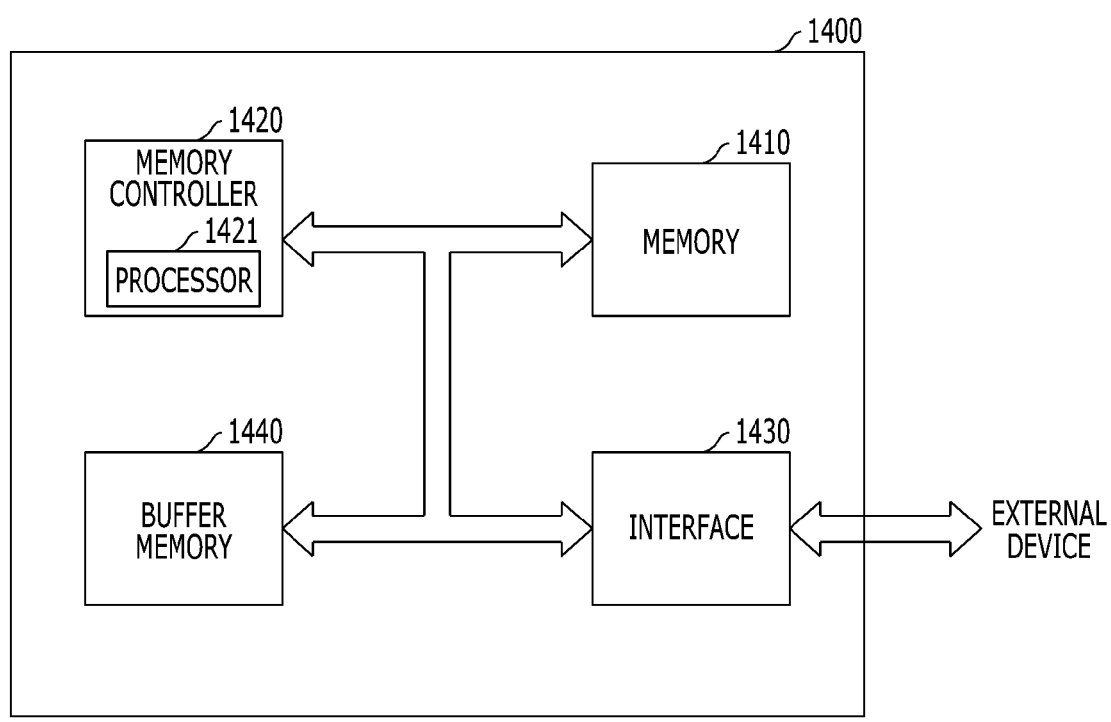
FIG. 12 is an example of configuration diagram of a memory system implementing memory circuitry based on the disclosed technology.

FIG. 12 is an example of configuration diagram of a memory system implementing memory circuitry based on the disclosed technology.

Referring to FIG. 12, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include an inter-layer dielectric layer including a hole over a substrate; a first nitride layer formed on sidewalls of the hole; a selector formed in a bottom portion of the hole and over the first nitride layer on the sidewalls of the hole; a stack including a variable resistance pattern formed over a lower structure including the selector; and a second nitride layer formed in an upper portion and on sidewalls of the stack. Through this, a fabrication process of the memory 1410 may be performed to improve the data storage characteristic of the memory 1410. As a consequence, operating characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include an inter-layer dielectric layer including a hole over a substrate; a first nitride layer formed on sidewalls of the hole; a selector formed in a bottom portion of the hole and over the first nitride layer on the sidewalls of the hole; a stack including a variable resistance pattern formed over a lower structure including the selector; and a second nitride layer formed in an upper portion and on sidewalls of the stack. Through this, a fabrication process of the buffer memory may be performed to improve the data storage characteristic of the buffer memory. As a consequence, operating characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 8-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this present document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory that comprises:
   an inter-layer dielectric layer disposed over a substrate and including a hole therein;
   a first nitride layer disposed over sidewalls of the hole;
   a selector disposed over the bottom of the hole and over the first nitride layer in the hole;
   a stacked structure including a variable resistance pattern disposed over a lower structure including the selector; and
   a second nitride layer disposed over a top surface and sidewalls of the stacked structure.

2. The electronic device according to claim 1, wherein the semiconductor memory further comprises:
   a contact plug penetrating the inter-layer dielectric layer and contacting the substrate and disposed below the first nitride layer and the selector in the hole.

3. The electronic device according to claim 1, wherein the semiconductor memory further comprises:
   a conductive line disposed over the substrate and being in contact with the selector.

4. The electronic device according to claim 1, wherein the semiconductor memory further comprises:
   a conductive line disposed over the substrate; and
   a contact plug for coupling the conductive line to the selector.

5. The electronic device according to claim 1, wherein the second nitride layer has higher nitrogen density than the first nitride layer.

6. The electronic device according to claim 1, wherein the selector includes one among selection elements such as a Metal Insulator Transition (MIT) layer, a crested barrier layer and an Ovonic Threshold Switch (OTS) layer.

7. The electronic device according to claim 2, wherein a line width of the selector is smaller than a line width of a top surface of the contact plug.

8. The electronic device according to claim 1, wherein the stacked structure further includes:
   a first electrode disposed below the variable resistance pattern; and
   a second electrode disposed over the variable resistance pattern.

9. The electronic device according to claim 8, wherein a portion of the first electrode fills a portion of the hole.

10. The electronic device according to claim 8, wherein the first electrode and the second electrode include a nitride and a transition metal selected from the group consisting of TiN, Pt, W, TaN, Ir, Ni, Cu, Ta, Ti, Hf and Zr.

11. The electronic device according to claim 1, wherein the variable resistance pattern includes a single-layer structure or a multi-layer structure.

12. The electronic device according to claim 1, wherein the variable resistance pattern includes one or more of a transition metal oxide, a perovskite-based material, a chalcogenide-based material, a high-K material, and a ferromagnetic material.

13. The electronic device according to claim 1, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory unit is part of the memory unit in the microprocessor.

14. The electronic device according to claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory unit is part of the cache memory unit in the processor.

15. The electronic device according to claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory unit is part of the auxiliary memory device or the main memory device in the processing system.

16. The electronic device according to claim 1, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory unit is part of the storage device or the temporary storage device in the data storage system.

17. The electronic device according to claim 1, further comprising a memory system which includes:
a memory configured to store data and conserve stored data regardless of power supply;
a memory controller configured to control input and output of data to and from the memory according to a command inputted form an outside;
a buffer memory configured to buffer data exchanged between the memory and the outside; and
an interface configured to perform communication between at least one of the memory, the memory controller and the buffer memory and the outside,
wherein the semiconductor memory unit is part of the memory or the buffer memory in the memory system.

18. An electronic device comprising a semiconductor memory that comprises:
a selector disposed over a substrate;
a first nitride layer disposed over sidewalls of the selector;
a stacked structure including a variable resistance pattern disposed over a lower structure including the selector; and
a second nitride layer disposed over a top surface and sidewalls of the stacked structure.

19. The electronic device according to claim 18, wherein the semiconductor memory further comprises a contact plug disposed between the substrate and the selector and contacting the selector to connect the selector and the substrate.

20. The electronic device according to claim 18, wherein the second nitride layer has higher nitrogen density than the first nitride layer.

21. The electronic device according to claim 18, wherein the selector includes one among selection elements such as a Metal Insulator Transition (MIT) layer, a crested barrier layer and an Ovonic Threshold Switch (OTS) layer.

22. The electronic device according to claim 18, wherein the stacked structure is disposed over the lower structure, the lower structure further including the first nitride layer, and
wherein the second nitride layer is further disposed over sidewalls of the first nitride layer.

23. A method for fabricating an electronic device including a semiconductor memory, the method comprising:
forming an inter-layer dielectric layer over a substrate;
forming a contact hole penetrating the inter-layer dielectric layer;
forming a contact plug filling a lower portion of the contact hole;
forming a first nitride layer over sidewalls of an upper portion of the contact hole and over the contact plug;
forming a selector in the upper portion of the contact hole and over the first nitride layer;
forming a stacked structure including a variable resistance pattern over a lower structure including the selector; and
forming a second nitride layer over a top surface and sidewalls of the stacked structure.

24. The method according to claim 23, wherein the forming of the contact plug includes:
filling the contact hole with a conductive material; and
removing a predetermined thickness of the conductive material.

25. The method according to claim 23, wherein the second nitride layer has higher nitrogen density than the first nitride layer.

26. The method according to claim 23, wherein the first nitride layer is formed in a shorter time than the second nitride layer.

27. The method according to claim 23, wherein the first nitride layer is formed through a Plasma Enhanced Chemical Vapor Deposition (PECVD) process.

28. The method according to claim 23, wherein the second nitride layer is formed through an Atomic Layer Deposition (ALD) process.

29. The method according to claim 23, wherein the stacked structure further comprises a first electrode and a second electrode, the forming of the stacked structure including:
    sequentially forming a first electrode layer, a variable resistance layer and a second electrode layer over the lower structure including the selector; and
    patterning the second electrode layer, the variable resistance layer and the first electrode layer to form the stacked structure including the first electrode, the variable resistance pattern and the second electrode.

30. The method according to claim 23, wherein the selector includes one among Metal Insulator Transition (MIT) layer, a crested barrier layer and an Ovonic Threshold Switch (OTS) layer.

31. The method according to claim 23, wherein the first electrode layer and the second electrode layer include a nitride and a transition metal selected from the group consisting of TiN, Pt, W, TaN, Ir, Ni, Cu, Ta, Ti, Hf and Zr.

32. The method according to claim 23, wherein the variable resistance pattern includes one or more of a transition metal oxide, a perovskite-based material, a chalcogenide-based material, a high-K material, and a ferromagnetic material.

33. The method according to claim 23, wherein the variable resistance pattern includes a single-layer structure or a multi-layer structure.

34. A method for fabricating an electronic device including a semiconductor memory, the method comprising:
    forming an inter-layer dielectric layer over a substrate;
    forming a contact hole penetrating the inter-layer dielectric layer;
    forming a contact plug filling the contact hole;
    forming a selector over the contact plug;
    forming a first nitride layer on sidewalls of the selector;
    forming a stacked structure including a variable resistance pattern over a lower structure including the selector; and
    forming a second nitride layer over a top surface and sidewalls of the stacked structure.

35. The method according to claim 34, wherein the lower structure further includes the first nitride layer, and
    wherein the stacked structure is formed over the lower structure, and the second nitride layer is formed to cover sidewalls of the first nitride layer.

* * * * *